(12) United States Patent
Cheng et al.

(10) Patent No.: US 7,762,449 B2
(45) Date of Patent: Jul. 27, 2010

(54) BOND HEAD FOR HEAVY WIRE BONDER

(75) Inventors: Chi Wah Cheng, New Territories (HK); Tim Wai Tony Mak, Chai Wan (HK); Hon Kam Boris Ng, New Territories (HK)

(73) Assignee: ASM Assembly Automation Ltd, Hong Kong (HK)

( * ) Notice: Subject to any disclaimer, the term of this patent is extended or adjusted under 35 U.S.C. 154(b) by 75 days.

(21) Appl. No.: 12/275,826

(22) Filed: Nov. 21, 2008

(65) Prior Publication Data

US 2010/0127045 A1 May 27, 2010

(51) Int. Cl.
*B23K 31/02* (2006.01)
*B23K 37/00* (2006.01)

(52) U.S. Cl. .................................. 228/180.5; 228/4.5
(58) Field of Classification Search ........................ None
See application file for complete search history.

(56) References Cited

U.S. PATENT DOCUMENTS

| | | | | |
|---|---|---|---|---|
| 3,307,763 | A * | 3/1967 | Rasimenoks et al. | 228/13 |
| 3,314,582 | A * | 4/1967 | Haigler | 228/1.1 |
| 3,543,988 | A * | 12/1970 | Kulicke, Jr. | 228/1.1 |
| 4,239,144 | A * | 12/1980 | Elles et al. | 228/1.1 |
| 4,351,468 | A * | 9/1982 | Floury et al. | 228/4.5 |
| 5,156,318 | A * | 10/1992 | Suzuki et al. | 228/4.5 |
| 5,660,316 | A * | 8/1997 | Magni | 228/1.1 |
| 5,868,300 | A * | 2/1999 | Babayan | 228/180.5 |
| 5,894,981 | A | 4/1999 | Kelly | |
| 6,161,747 | A * | 12/2000 | Ushiki et al. | 228/4.5 |
| 6,193,130 | B1 * | 2/2001 | Ushiki et al. | 228/6.2 |
| 6,206,275 | B1 * | 3/2001 | Biggs | 228/180.5 |
| 6,439,448 | B1 * | 8/2002 | Ringler | 228/110.1 |
| 6,471,116 | B2 * | 10/2002 | Copperthite | 228/180.5 |
| 6,505,823 | B2 * | 1/2003 | Ushiki et al. | 269/21 |
| 6,513,696 | B1 * | 2/2003 | Ho et al. | 228/4.5 |
| 6,616,030 | B2 * | 9/2003 | Miller | 228/4.5 |
| 6,827,248 | B2 | 12/2004 | Farassat | |
| 6,861,771 | B2 * | 3/2005 | Zhai et al. | 310/12.27 |
| 6,905,058 | B2 * | 6/2005 | Farassat | 228/1.1 |
| 7,004,373 | B1 * | 2/2006 | Miller | 228/103 |
| 7,458,496 | B2 * | 12/2008 | Farassat | 228/4.5 |
| 7,641,097 | B2 * | 1/2010 | Nachon et al. | 228/4.5 |
| 7,681,774 | B2 * | 3/2010 | Frasch et al. | 228/4.5 |
| 2006/0065695 | A1 * | 3/2006 | Laurent | 228/4.5 |
| 2006/0278682 | A1 * | 12/2006 | Lange et al. | 228/4.5 |

FOREIGN PATENT DOCUMENTS

| | | | |
|---|---|---|---|
| JP | 58209494 A | * | 12/1983 |
| JP | 02248055 A | * | 10/1990 |
| JP | 01150330 A | * | 6/1999 |
| JP | 200031193 A | * | 1/2000 |

* cited by examiner

*Primary Examiner*—Kiley Stoner
(74) *Attorney, Agent, or Firm*—Ostrolenk Faber LLP

(57) ABSTRACT

A bonding apparatus for bonding a length of wire comprises a first module which is drivable along a linear axis towards and away from a bonding point and a second module slidably mounted to the first module. A wire cutter is mounted to the first module and a bonding tool is mounted to the second module. A coupling mechanism is operative to lock the second module in fixed relative position to the first module, and to unlock the second module from its fixed relative position to the first module so that the second module is slidable relative to the first module in directions parallel to the linear axis.

20 Claims, 7 Drawing Sheets

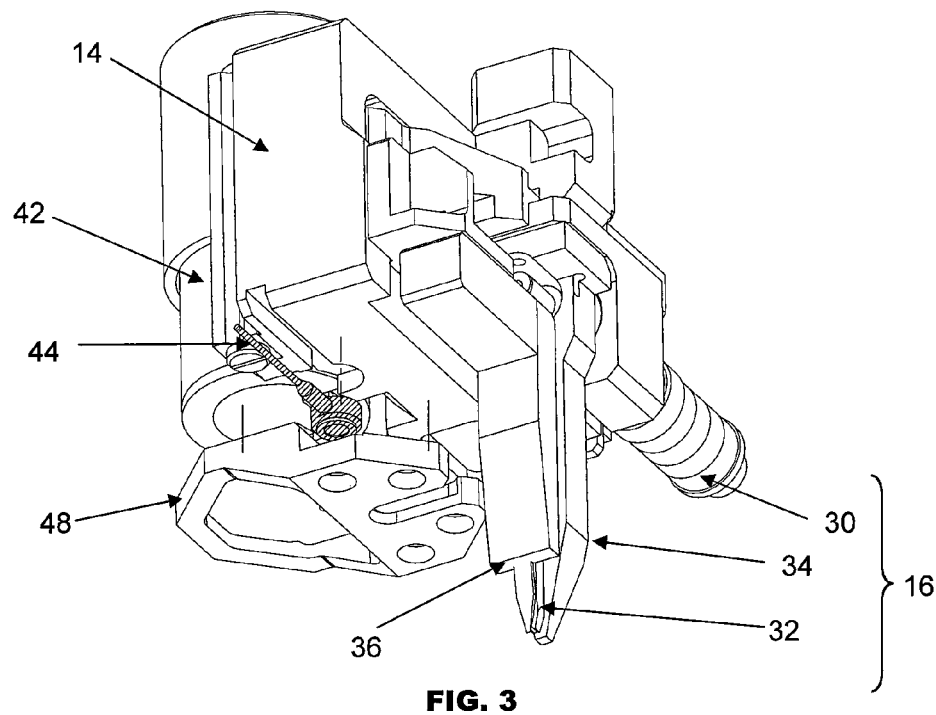
FIG. 3
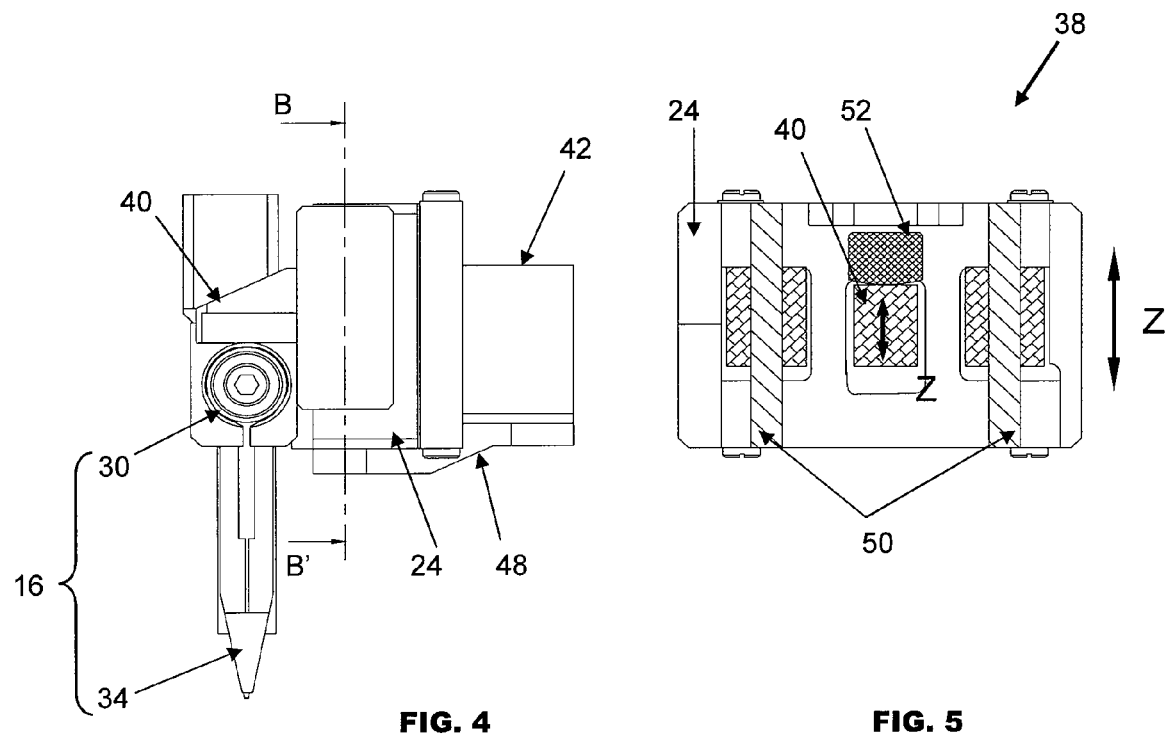
FIG. 4     FIG. 5

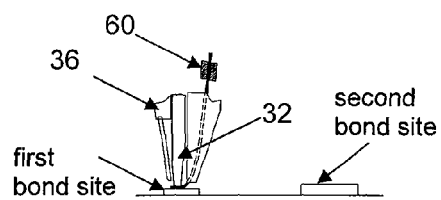
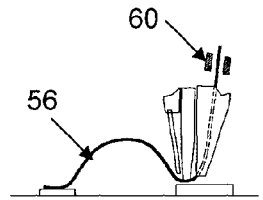
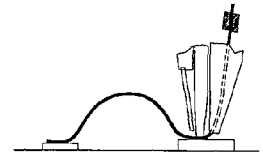
FIG. 7A  FIG. 7B  FIG. 7C
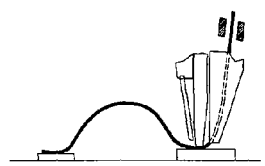
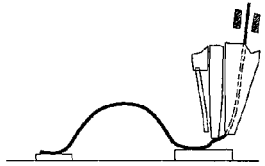
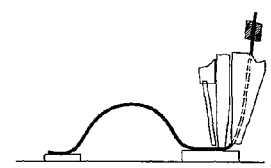
FIG. 7D  FIG. 7E  FIG. 7F
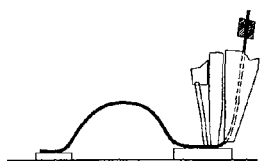
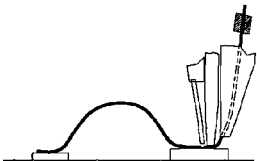
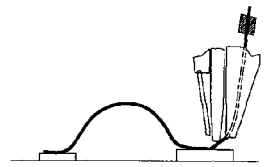
FIG. 7G  FIG. 7H  FIG. 7I
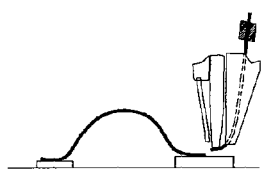
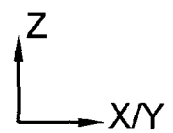
FIG. 7J

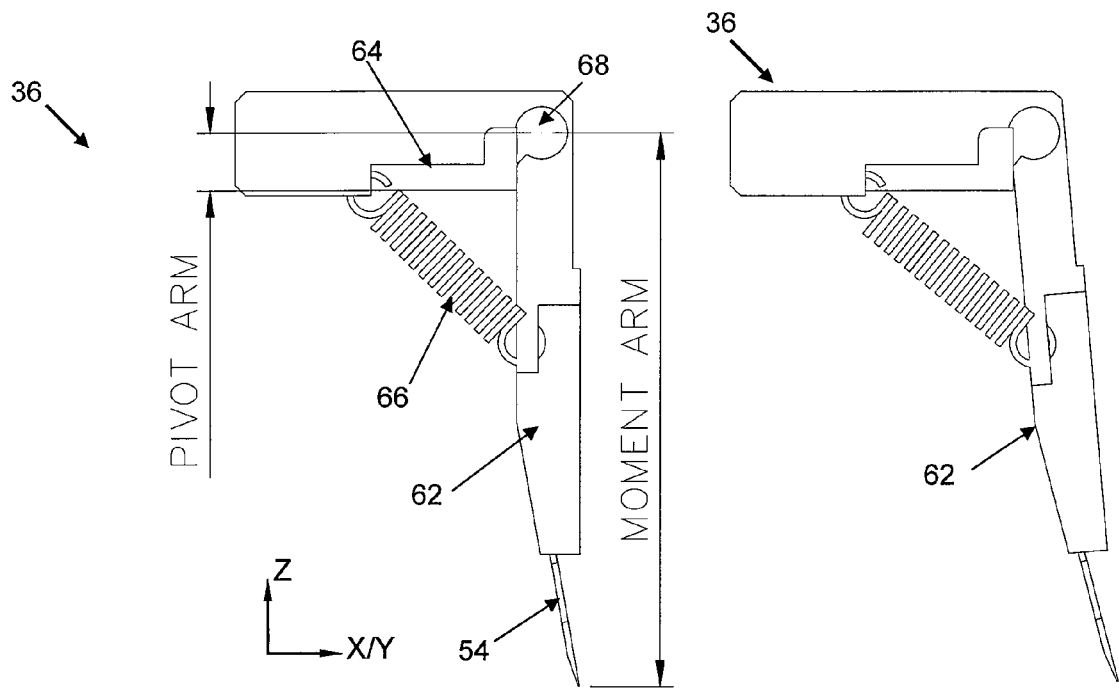
FIG. 8A  FIG. 8B
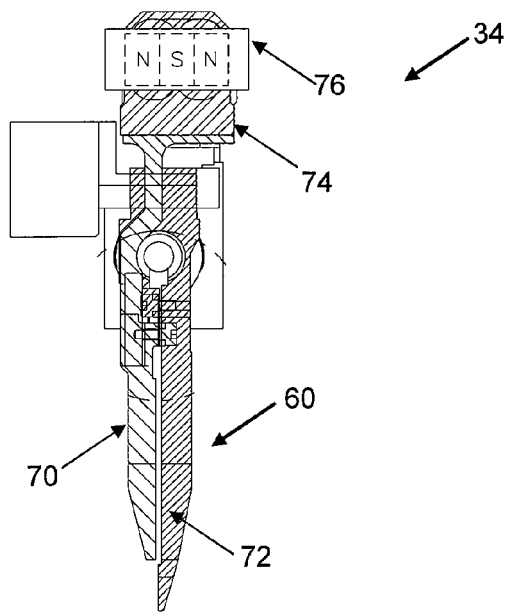
FIG. 9

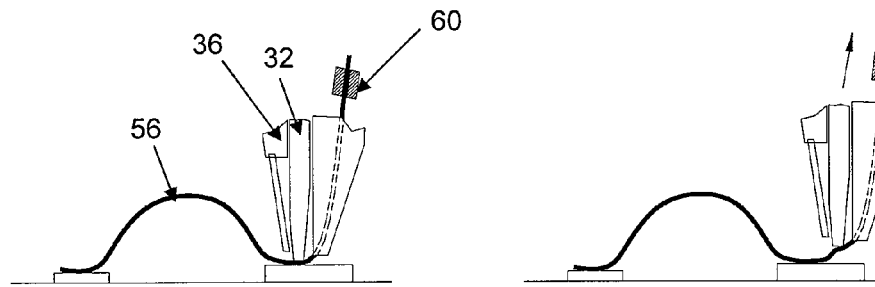
FIG. 10A  FIG. 10B
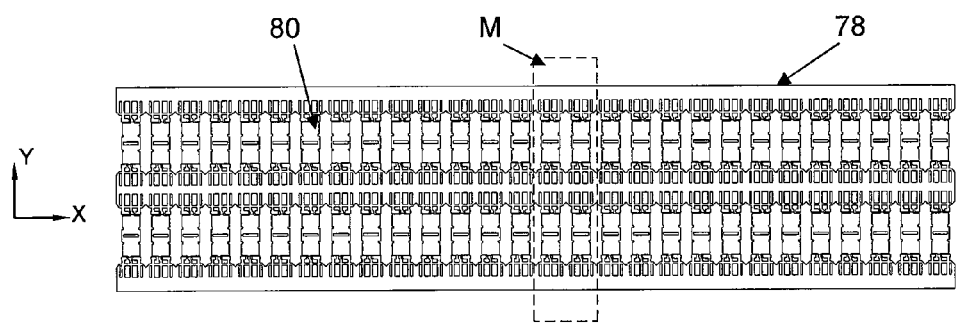
FIG. 11
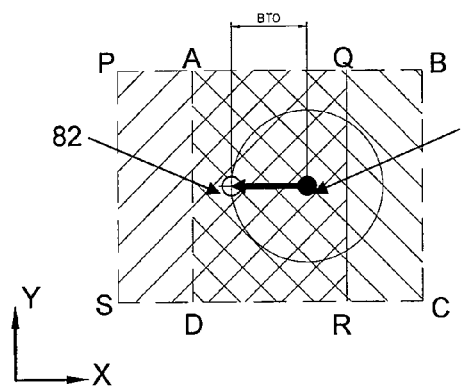 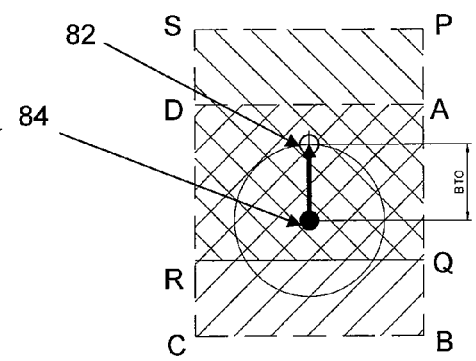
FIG. 12  FIG. 14

BOND HEAD FOR HEAVY WIRE BONDER

FIELD OF THE INVENTION

The invention relates to a bond head for bonding wires to an electronic component with a bonding tool, and in particular to the bonding of wires having relatively large diameters.

BACKGROUND AND PRIOR ART

Typically, relatively large and heavy wires such as aluminum wire are used in wedge bonding on high power electronic packages. A bonding machine using wires with such large diameters for bonding generally comprises a bond head that is able to position itself relative to the electronic packages in the X, Y, Z and theta axes for wedge bonding. Having a theta axis is necessary in wedge bonding for aligning the bond orientation with the wire being fed between a first bond and a second bond.

Unlike thin wires, it is not possible to tear a large-sized wire away from the second bond solely by pulling it with a wire clamp after completing wire bonding at the second bond. The wire is usually cut partially by a cutter after the second bond is formed, and thereafter may be torn by the pulling movement of the bond head in a horizontal direction along the wire angle such that the tail of the cut wire remains under a bonding tool for subsequent bonding.

A conventional method of bonding and cutting large wires uses a flexible support such as a flexural disk to support a bonding tool. The bonding tool may include a transducer with a wedge and/or a wire clamp and a wire guide. A cutter is rigidly mounted to a bond head. When the bond head is oriented at the same direction as the orientation of the wire after a second bond is completed, the bond head is lowered further for cutting the wire. The wedge touches the wire with a preset force which does not damage the wire. Further downward movement of the bond head to allow the cutter to cut the wire can be achieved due to the flexible support provided by the flexural disk. Thus, the cutter moves together with the bond head to cut the wire with the wedge remaining relatively stationary. U.S. Pat. No. 6,439,448 entitled "Large Wire Bonder Head" discloses an example of such a bond head for a large wire bonder which adopts two circular flexural disks for providing flexible vertical movement of the bonding tool. For wire cutting, the flexural disks permit the bonding tool to touch the wire softly with a programmable force that is driven by a coil and magnet system. The cutter is pushed towards the wedge after bonding to cut the wire, and moves back to its original position after cutting the wire. The shortcoming of this apparatus is that the flexural disks result in the bonding tool having insufficient rigidity during wire bonding operations, which may lead to unstable bonds being formed.

It is also important that the cutter of a bond head is protected from hitting hard surfaces as it cuts the wire, such as the surface of the substrate on which wire bonding is performed. U.S. Pat. No. 6,827,248 entitled "Cutting Device for Bonded Wires" discloses a wire cutter which is elastically mounted onto a bond head such that the cutter can move upwards when the cutting force approaches a peak force limit. In this way, the cutter is protected from impact when it hits hard surfaces. However, the peak force limit varies with the material selected for providing elasticity. Wires of different types and sizes also require different peak force limits during cutting. Therefore, a universal design of the elastic mount for the cutter is not possible for cutting wires of different types and sizes.

It is further beneficial to be able to test the strength of bonds (either the first bond and/or the second bond) after bonding to check if the bonds formed are strong. U.S. Pat. No. 5,894,981 entitled "Integrated Pull Tester With An Ultrasonic Wire Bonder" discloses a wire bond head which is integrated with a pull tester for testing the strength of the bonds. The test is conducted by pulling the wire after bonding with a closed wire clamp or with a friction disk when the bond head moves upwards. The feeding length of the wire is detected by an encoder which determines whether the bond is defective. If the bond leaves the substrate such that no wire feeding is detected during the pulling test, the bond is defective. If a certain amount of wire feeding is detected, the bond is deemed good as the bond has adhered to the bond pad. However, detecting wire feeding during such pull test is not reliable as wires may elongate to different extents even for wires of the same material. In fact, the variation of the extent of wire elongation during the pull test is on a similar scale to the small amount of wire feeding detected for a good bond. This makes the said pull test unreliable as the supposed wire feeding may be due to wire elongation.

It is thus desirable to design a bond head for cutting large wires with precision while avoiding damage to the cutter. It is also useful to devise a reliable wire pull test.

SUMMARY OF THE INVENTION

It is thus an object of the invention to seek to provide a bond head which enhances control of the positioning of wire bonding and wire cutting components of a bond head during wire bonding and wire cutting.

According to a first aspect of the invention, there is provided a bonding apparatus for bonding a length of wire, comprising a first module which is drivable along a linear axis towards and away from a bonding point; a second module slidably mounted to the first module; a wire cutter mounted to the first module and a bonding tool mounted to the second module; and a coupling mechanism operative to lock the second module in fixed relative position to the first module, and to unlock the second module from its fixed relative position to the first module so that the second module is slidable relative to the first module in directions parallel to the linear axis.

According to a second aspect of the invention, there is provided a method of bonding a length of wire with a bonding apparatus comprising a first module and a second module slidably mounted to the first module, the method comprising the steps of locking the second module in fixed relative position to the first module with a coupling mechanism; driving the first module and second module along a linear axis towards a bonding point and forming a bonded wire at the bonding point with a bonding tool mounted on the second module; unlocking the second module from its fixed relative position to the first module to allow the second module to slide relative to the first module parallel to the linear axis; driving the first module towards the wire to cut the wire with a wire cutter mounted to the first module; and thereafter lifting the wire cutter away from the bonded wire.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIG. 3 is an isometric view of the rotary bond head of FIG. 1 with its pattern recognition ("PR") alignment optics removed to illustrate a force sensor for bond force control and cutting force control;

FIG. 4 is a side view of the rotary bond head as seen from direction A of FIG. 2;

FIG. 5 is a sectional view of the rotary bond head along sectional line B-B' of FIG. 4 which illustrates a coupling mechanism;

FIGS. 7A to 7J illustrate a bonding sequence using the rotary bond head according to the preferred embodiment of the invention;

FIGS. 8A and 8B are side views of a wire cutter assembly incorporated in the rotary bond head of FIG. 1 respectively showing a linear cutter actuator at rest and the linear cutter actuator extended;

FIG. 9 is a sectional view of a wire clamp assembly which is mounted to the rotary bond head of FIG. 1;

FIGS. 10A and 10B illustrate a working sequence of an integrated pull test using the rotary bond head of FIG. 1;

FIG. 11 is a plan view of a matrix-type leadframe with multiple rows of packages;

FIG. 12 is a schematic drawing illustrating an effective bonding area when an optical center of the PR alignment optics is aligned with a bond tip center or a center of rotation of the bond head along the X axis;

FIG. 14 is a schematic drawing illustrating an effective bonding area when the optical center of the PR alignment optics is aligned with the bond tip center or the center of rotation of the bond head along the Y axis.

DETAILED DESCRIPTION OF THE PREFERRED EMBODIMENT OF THE INVENTION

Figure 1:
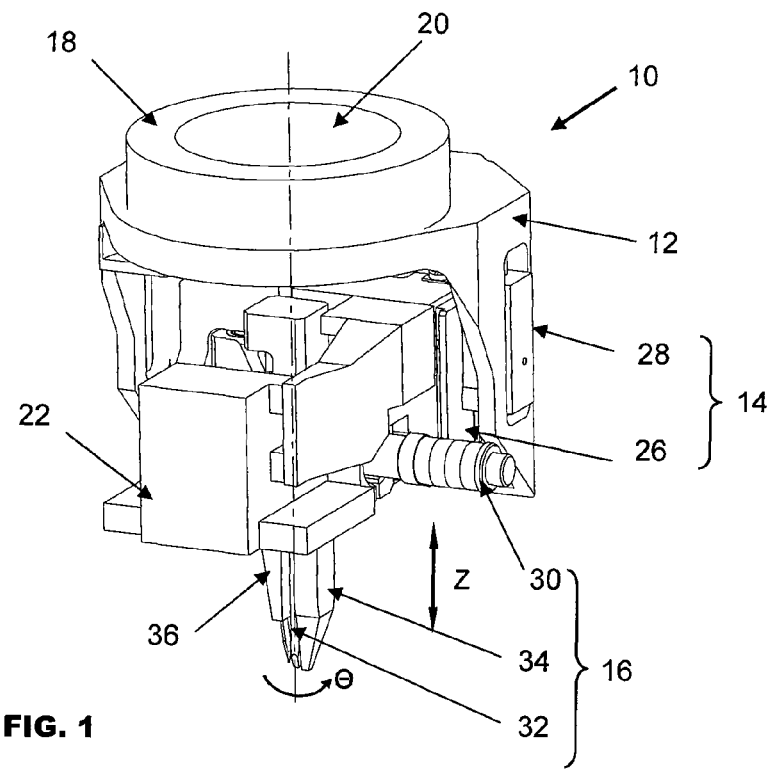
FIG. 1 is an isometric view of a rotary bond head according to the preferred embodiment of the invention.

FIG. 1 is an isometric view of a rotary bond head 10 according to the preferred embodiment of the invention. The bond head 10 comprises three primary modules, namely a bond head mounting bracket 12, a first or main Z module 14 and a second or subsidiary Z module 16. The main Z module 14 and subsidiary Z module 16 are drivable along a linear Z axis towards and away from a bonding point.

The bond head mounting bracket 12 houses and supports the main Z module 14 of the bond head 10 and is mounted on a rotary motor assembly 18 as well as on an X-Y table (not shown). The rotary motor assembly 18, which may comprise a direct drive motor, is mounted on top of the bond head mounting bracket 12 and drives and rotates a bonding tool in the theta axis about the Z axis to the desired theta orientation before making a first wedge bond. A central opening 20 located in the rotary motor assembly 18 allows a light path parallel to the Z axis to pass from the bonding point through to an optical assembly comprising PR alignment optics 22. Alternatively, a timing pulley belt and motor system may also be used to rotate the bond head 10 to the desired theta orientation.

The PR alignment optics 22 is mounted on a main Z bracket 24 which is part of the main Z module 14. The main Z module 14 is rotated to align the orientation of the bonding tool with the orientation of the bonding points during wire bonding. Therefore, it is advantageous that the PR alignment optics 22 can move with the bond head mounting bracket 12 so as to conduct PR alignment for viewing the orientations of multiple bonding points for bonding. As the PR alignment optics 22 moves with the main Z module 14, its Z or vertical position can be adjusted accordingly. Thus, focusing can be adjusted and recorded either manually or automatically.

The main Z module 14 is slidably mounted by means of a pair of cross rollers to the bond head mounting bracket 12. The main Z module 14 further includes a linear encoder comprising a Z position linear encoder scale 26 cooperating with a Z position read head 28.

A transducer 30, the bonding tool in the form of a bonding wedge 32 and its holder, a wire clamp assembly 34 and other components which move together with the transducer 30 are mounted onto the subsidiary Z module 16. A wire cutter assembly 36 is appended next to the wire clamp assembly 34 and the bonding wedge 32 and is mounted to the Z module 14. This facilitates cutting the wire after a bond is formed.

Figure 2:
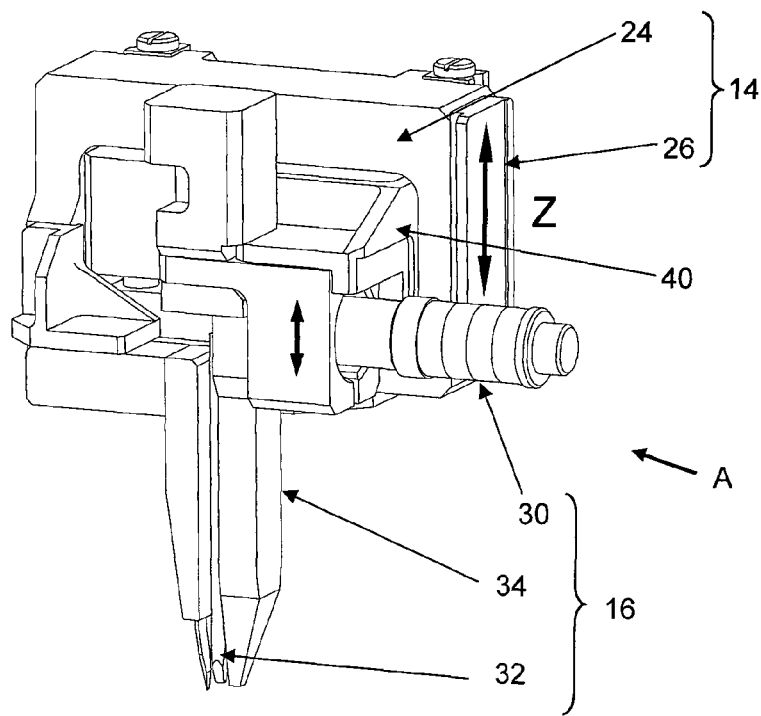
FIG. 2 is an isometric view of part of the rotary bond head of FIG. 1 illustrating the bond head's main and subsidiary Z modules.

FIG. 2 is an isometric view of part of the rotary bond head 10 of FIG. 1 illustrating the bond head's main and subsidiary Z modules 14, 16. For clarity, the bond head mounting bracket 12 has been removed from this figure. The main Z module 14 is coupled to the subsidiary Z module 16 by means of a subsidiary Z bracket 40 and a main Z bracket 24. The subsidiary Z module 16 is supported by the bond head mounting bracket 12 through the subsidiary Z bracket 40.

The Z position linear encoder scale 26 is mounted to the main Z bracket 24, and the Z position read head 28 is mounted to the bond head mounting bracket 12. The read head 28 detects the Z position of the main Z module 14 which is then fed back to a control system (not shown).

FIG. 3 is an isometric view of the rotary bond head 10 of FIG. 1 with its PR alignment optics 22 removed to illustrate a force sensor 44 for bond force control and cutting force control. Also illustrated is a linear motor 42. The main Z module 14 comprises the linear motor 42, the main Z bracket 24, the force sensor 44 and the linear encoder scale 26 cooperating with the read head 28.

The linear motor 42 drives the main Z module 14 and the subsidiary Z module 16 along the Z axis towards and away from the bonding point. The linear motor 42 is preferably a round voice coil motor to efficiently utilize the limited space of the bond head 10. The main Z module 14 is directly coupled to a movable coil of the linear motor 42 through a mounting plate 48 of the linear motor 42. The wire cutter assembly 36 is mounted to the main Z module 14 through a cutter mounting bracket.

The force sensor 44 is placed at one of the mounting screws of the mounting plate 48 such that it is coupled between the main Z module 14 and the linear motor 42. This enables action and reaction forces acting on the main Z module 14 to be measured and fed back to the control system.

FIG. 4 is a side view of the rotary bond head 10 as seen from direction A of FIG. 2. The subsidiary Z module 16 is slidably mounted to the main Z bracket 24 through the subsidiary Z bracket 40. This view also shows that the main Z bracket 24 is coupled to the linear motor 42 by the mounting plate 48 which is located below the main Z bracket 24 and the linear motor 42.

FIG. 5 is a sectional view of the rotary bond head 10 along sectional line B-B' of FIG. 4 which illustrates a coupling mechanism 38. The coupling mechanism 38 includes a linear guide 50, which may comprise guide rods and a linear bushing, and an actuator 52 in the form of air cylinder, solenoid or other forms of actuators that may provide a force to releasably lock the subsidiary Z module 16 to the main Z module 14.

When the actuator 52 is activated, the coupling mechanism 38 locks the subsidiary Z module 16 in fixed relative position to the main Z module 14 so that they can move together. When the actuator 52 is deactivated, the coupling mechanism 38 unlocks the subsidiary Z module 16 from its fixed relative position to the main Z module 14 so that the subsidiary Z module 16 is slidable relative to the main Z module 14 in directions parallel to the Z axis.

Therefore, when the coupling mechanism 38 is deactivated and the subsidiary Z module 16 is unlocked from the main Z module 14, it allows the main Z module 14 to move while the subsidiary Z module 16 is relatively stationary and vice versa. The relative sliding movement between the main Z module 14 and the subsidiary Z module 16 is guided by the linear guide 50.

Figure 6A:
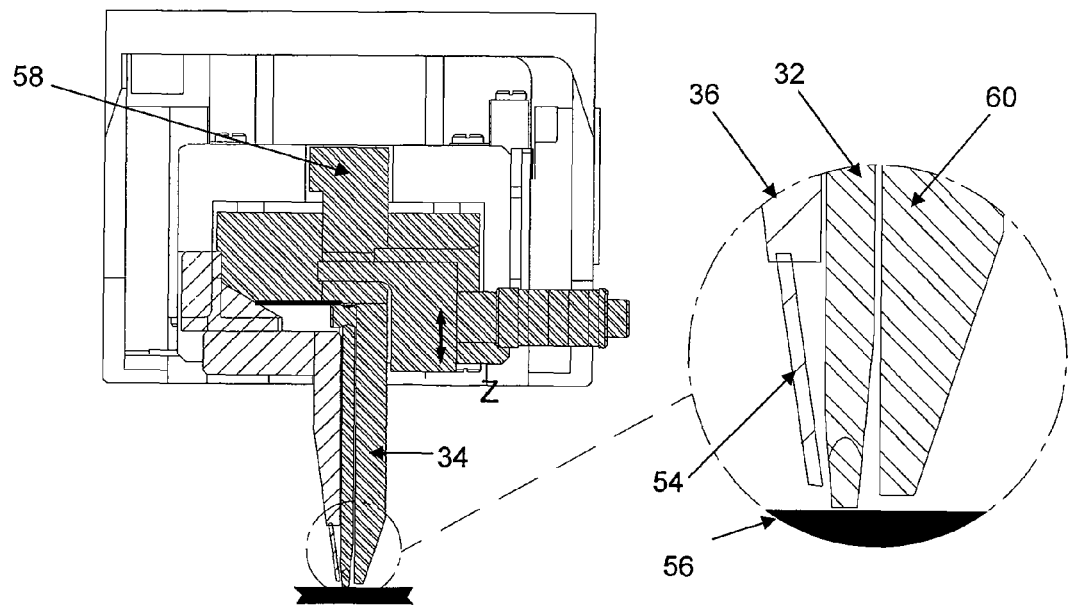
FIGS. 6A and 6B are enlarged sectional views of a tip of a bonding tool when the coupling mechanism is activated and deactivated respectively.
Figure 6B:
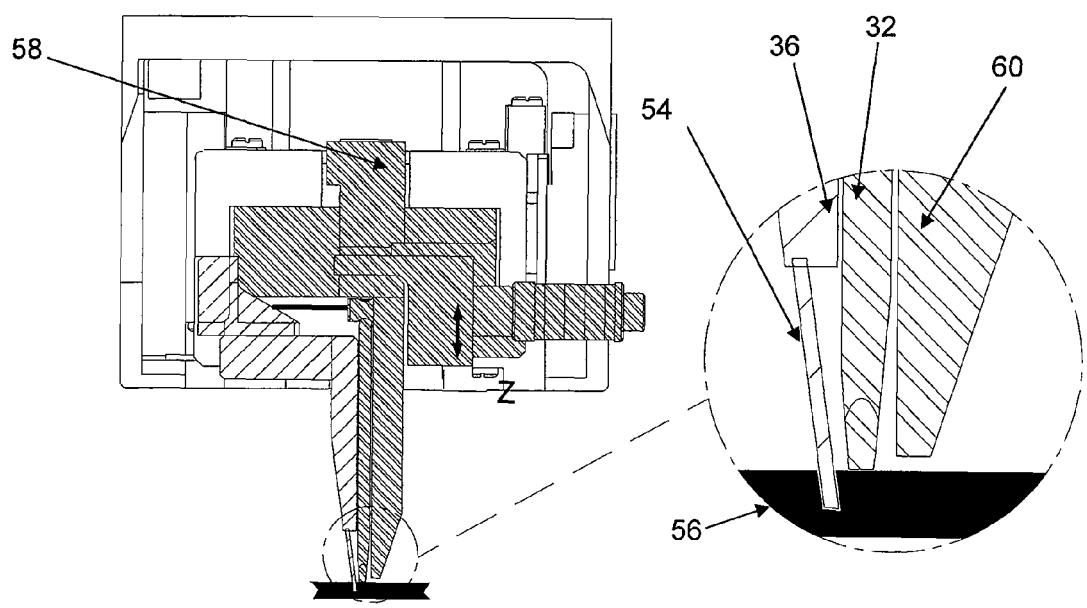

FIGS. 6A and 6B are enlarged sectional views of the tip of the bonding tool when the coupling mechanism 38 is activated and deactivated respectively. In FIG. 6A, the tip of the bonding tool or wedge 32 is shown mounted to the subsidiary Z module 16. During bonding, the tip of the wedge 32 is usually located at a distance equal to about a diameter of the wire lower than the tip of a wire cutter 54 of the wire cutter assembly 36. As a result, the tip of the wedge 32 presses on a wire of large diameter, such as an aluminum wire 56, during bonding without the wire cutter 54 contacting and damaging the wire 56.

In FIG. 6B, the coupling mechanism 38 is deactivated to unlock the subsidiary Z module 16 from the main Z module 14 before the tip of the wire cutter 54 moves down to cut the wire 56. The wire cutter 54 is driven downwards by the linear motor 42 of the main Z module 14 to cut the wire after completing the second bond. The tip of the wedge 32 presses on the wire 56 lightly mainly with the weight of the subsidiary Z module 16. The tip of the wire cutter 54 then cuts into the wire 56 by a distance of between 0.6 to 0.9 times of a diameter of the wire 56, thus partially but not fully cutting the wire 56.

FIGS. 7A to 7J illustrate a bonding sequence using the rotary bond head 10 according to the preferred embodiment of the invention. In FIG. 7A, the main Z module 14 of the bond head 10 initiates the creation of a first bond at a first bonding point with a wire clamp 60 of the wire clamp assembly 34 closed and the coupling mechanism 38 activated.

In FIG. 7B, the main Z module 14 forms a loop with the wire clamp 60 open after leaving the first bond and as it moves towards a second bonding point.

In FIG. 7C, the main Z module 14 moves down to form a second bond with the wire clamp 60 closed and the coupling mechanism 38 activated.

FIG. 7D shows an optional step when the wire 56 accumulates between the tip of the wedge 32 and the wire clamp 60. The main Z module 14 moves down to form the second bond when the wire clamp 60 is opened and the coupling mechanism 38 is activated.

After forming the second bond, the main Z module 14 is raised slightly with the wire clamp 60 open as shown in FIG. 7E such that the bond head 10 moves upwards along the wire 56 and the tip of the wire cutter 54 is located at a position above the point where the wire 56 is to be cut.

In FIG. 7F, the coupling mechanism 38 is deactivated and the main Z module 14 is driven down towards the wire 56 with the wire clamp 60 closed for wire cutting.

In FIG. 7G, the main Z module 14 drives the tip of the wire cutter 54 into the wire 56 to cut the wire 56 when the wedge 32 of the subsidiary Z module 16 remains in light contact with the wire 56.

In FIG. 7H, the wire 56 is cut almost completely and the main Z module 14 moves up together with the tip of the wire cutter 54 while the wedge 32 remains lightly in contact with the wire 56 and the coupling mechanism 38 remains deactivated.

In FIG. 7I, the main Z module 14 lifts the tip of the wire cutter 54 away from the bonded wire to a level that is slightly higher than the tip of the wedge 32, which is now no longer pressing on the wire 56, before the coupling mechanism 38 is activated to lock the subdiary Z module 16 to the main Z module 14. The bond head 10 moves away from the second bond along the wire feed direction so as to tear the wire 56 completely. The bond head 10 then moves to the next bonding position to form another first bond. The bonding sequence as described is then repeated.

FIGS. 8A and 8B are side views of the wire cutter assembly 36 incorporated in the rotary bond head 10 of FIG. 1 respectively showing a linear cutter actuator 64 at rest and the linear cutter actuator 64 extended. The wire cutter assembly 36 comprises the wire cutter 54, a cutter bracket 62, the linear cutter actuator 64 which is preferably a piezoelectric actuator, and a preload tensile spring 66.

As shown in FIG. 8A, the wire cutter assembly 36 is at a resting state when the linear cutter actuator 64 is deactivated. The preload force of the spring 66 will bias the wire cutter assembly 36 against the linear cutter actuator 64 such that the cutter bracket 62 is held in a substantially vertical position and retracted against the linear cutter actuator 64 at one end.

When the linear cutter actuator 64 is activated to extend to a preset length, the cutter bracket 62 is pushed outwards away from its vertical position as shown in FIG. 8B. The cutter bracket 62 tilts away from the linear cutter actuator 64 so that the tip of the tip of the wire cutter 54 moves outwards. A recess 68 is located at a corner where the cutter bracket 62 meets the linear cutter actuator 64.

When the linear cutter actuator 64 pushes into the recess 68, the cutter bracket 62 correspondingly tilts about this corner.

The movement of the tip of the wire cutter 54 is magnified to a significant degree by a ratio of the distance between the tip of the wedge 32 and the center of the recess 68, as compared to the distance between the center line of the piezoelectric linear cutter actuator 64 and the center of the recess 68. Therefore, by adjusting the orientation of the wire cutter 54, the linear cutter actuator 64 permits programmable adjustment of the horizontal position of the tip of the wire cutter 54 to a position close to the tip of the wedge 32 according to requirements. The length of the wire 56 before the next first bond can also be adjusted accordingly. This adjustment is optional but is preferred to be carried out for wires of different sizes and when there are variable space requirements for different packages.

FIG. 9 is a sectional view of the wire clamp assembly 34 which is mounted to the rotary bond head 10 of FIG. 1. The wire clamp assembly 34 is mounted near the axis of rotation of the bond head 10 and comprises a movable jaw 70, a fixed jaw 72 and an actuating motor such as a voice coil 74. The voice coil 74 is coupled to the movable jaw 70 to provide a clamping force and a force to move the movable jaw 70. A magnet assembly 76 is mounted to the subsidiary Z bracket 40 and is stationary relative to the voice coil 74 and the movable jaw 70. The magnet assembly 76 provides a magnetic field for the voice coil 74.

The fixed jaw 72 is mounted to the subsidiary Z bracket 40 so that it is at a fixed position relative to the wedge 32 and the transducer 30. The movable jaw 70 is flexibly coupled to the fixed jaw 72. Using the clamping force provided by the voice coil 74, the movable jaw 70 opens or closes with respect to the fixed jaw 72. This clamping force is programmable according to requirements.

Both the movable jaw 70 and the fixed jaw 72 extend largely vertically with the voice coil 74 and the magnet assembly 70 positioned above them. As a result, the entire wire clamp assembly 34 is located substantially along the axis of rotation of the bond head 10 such that a moment of inertia of the bond head 10 during rotation is reduced. This increases the stability of the bond head 10 to facilitate the rotation of the bond head 10 and the vertical movements of the main and subsidiary Z modules 14, 16.

FIGS. 10A and 10B illustrate a working sequence of an integrated pull test using the rotary bond head 10 of FIG. 1. The pull test may check the quality of both the first and second bonds formed. After completing the second bond, the wire clamp 60 is closed and the main Z module 14 is driven upwards away from the bonded wire gradually to create a tension or a predetermined pulling force on the wire connected to the bonded wire 56. The force of the linear motor 42 acting on the main Z module 14 increases gradually and stays at a preset force value which is about ⅓ of the tensile strength. The pulling force is detected and monitored by the force sensor 44.

The wire clamp 60 moves upwards together with the main Z module 14 when the coupling mechanism 38 is activated and the wire clamp 60 holds the wire 56 firmly to avoid slippage. The bond is classified as good when the pulling force as sensed by the force sensor 44 remains at the preset value during testing or during a tension ramping up period. The position of the main Z module 14 is also monitored to determine if the wire bond formed is defective. When the bond is good, the position of the main Z module 14 stays at a level below a protected limit which is detectable by the linear encoder during the same test period. However, when the bond is defective, either when the wire 56 breaks or when the bond lifts away from the substrate where it is bonded, the pulling force will drop and the position of the main Z module 14 will also rise sharply to reach the protected limit. This could happen during ramping up the tension on the bond or during the testing period. A real time pull test at the bond head 10 is therefore provided by the force sensor 44 and the linear encoder.

FIG. 11 is a plan view of a matrix-type leadframe 78 with multiple rows of packages 80 arranged along its length. Wire bonding of this type of leadframe 78 is performed in a "columnar" manner. This means that for one indexing shift of the leadframe 78, one or a few columns of the packages 80 are wire bonded and then the leadframe 78 is indexed for the next group of columns. Thus, the bonding area which facilitates wire bonding for one or a few columns of the packages 80 is like a vertical rectangle as indicated in the dotted box M.

FIG. 12 is a schematic drawing illustrating an effective bonding area when the optical center 82 of the PR alignment optics 22 is aligned with the bond tip center 84 or the center of rotation of the bond head 10 along the X axis. The boundary of the accessible areas of the optical center 82 of the optical system and the bond tip center 84 (wedge tip) are respectively represented by boxes PQRS and ABCD. However, as PR alignment is necessary in order to locate bonds accurately, the useful bonding area is limited to the overlapping area of the boxes PQRS and ABCD. This is when the main Z module 14 is rotated to an orientation such that the optical center 82 is located and aligned next to the bond tip center 84 in the X-direction which is parallel to the length of the leadframe 78 such that the useful bonding area is a rectangular box AQRD with the longer length AD, QR aligned in the Y-axis corresponding with the orientation of the column of packages for wire bonding of the matrix-type leadframe 78 of FIG. 11. Thus, this orientation of the main Z module 14 is suitable for wire bonding involving matrix-type leadframes.

Figure 13:
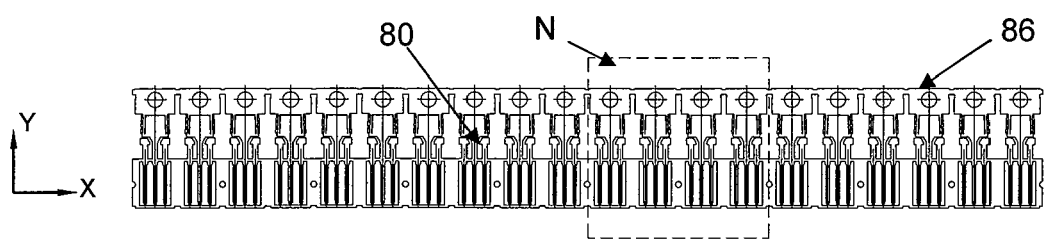
FIG. 13 is a plan view of a leadframe with a single row of packages.

FIG. 13 is a plan view of a leadframe 86 with a single row of packages 80 arranged along its length. To improve bonding throughput, for one indexing shift of the leadframe 86, a few consecutive packages 80 along the row are clamped and bonded. Thus, the required bonding area is a horizontal rectangle, like the dotted box N in this figure.

FIG. 14 is a schematic drawing illustrating an effective bonding area when the optical center 82 of the PR alignment optics 22 is located and aligned with the bond tip center 84 or the center of rotation of the bond head 10 along the Y axis. The Y axis is perpendicular to the length of the leadframe. The main Z module 14 is rotated to this orientation by rotating it by 90 degrees from the configuration of the main Z module 14 for use with the matrix-type leadframe 78. The useful bonding area is limited to the overlapping area of boxes PQRS and ABCD. This is a rectangular box AQRD with the longer length AD, QR aligned with the X axis corresponding with the orientation of the row of packages on the lead frame 86. Thus, this configuration of the main Z module 14 is suitable for wire bonding involving a lead frame with a single row of packages 80 arranged along its length. Therefore, the orientation of the bonding tip of the wedge 32 relative to the PR alignment optics 22 determines the effective bonding area available for different types of lead frames.

It should be appreciated that the bond head 10 according to the preferred embodiment of the invention provides both positional control and force control during wire bonding and wire cutting. During wire bonding, the linear encoder provides feedback of the position of the main Z module 14 and the bonding tool or wedge 32. This allows for accurate positioning of the bond head 10 and the bonding tool. It is especially important when the bonding tool approaches the bonding surface as well as during loop formation. At the same time, the force sensor 44 which is coupled between the linear motor 42 and the main Z module 14, detects the contact between the bonding tool and the bonding surface precisely such that an impact force acting on the wire 56 can be controlled and reduced to a low level so as not to cause unnecessary damage to the wire 56. Moreover, the bonding force can be controlled more accurately with feedback from the force sensor 44.

During wire cutting, accurate positional control is maintained to achieve a more precise depth of cut into the wire 56. Monitoring of wire cutting is provided by the force sensor 44 so that excessive cutting force can be avoided by raising the main Z module 14 and the tip of the wire cutter 54 once an excessive cutting force is detected. This avoids causing damage to the packages 80. The wire cutter assembly 36 can also last longer by avoiding hard impact between the tip of the wire cutter 54 and the bonding surface. The wire cutter assembly 36 is simple and light which also reduces cost and maintenance.

Furthermore, the bond head 10 is more stable since the wire clamp assembly 34 is closer to the center of rotation of the bond head 10 such that its moment of inertia is reduced. Having feedback regarding the position of the main and subsidiary Z modules 14, 16 and the wire clamp 60 by the linear encoder as well as feedback by the force sensor 44 of the pulling force acting on the wire 56 when the wire 56 is held by the wire clamp 60 provides a real time pull test. Monitoring of the quality of bonds formed is therefore possible without having a separate pull tester. Moreover, a greater effective bonding area is achievable by rotating the bond head 10 to vary the orientation of the bond tip center 84 in relation to the PR alignment optics 22 according to the arrangement of packages 80 on the leadframe.

The invention described herein is susceptible to variations, modifications and/or additions other than those specifically described and it is to be understood that the invention includes all such variations, modifications and/or additions which fall within the spirit and scope of the above description.

The invention claimed is:

1. Bonding apparatus for bonding a length of wire, comprising:
   a first module which is drivable along a linear axis towards and away from a bonding point;
   a second module slidably mounted to the first module;
   a wire cutter mounted to the first module and a bonding tool mounted to the second module; and
   a coupling mechanism operative to lock the second module in fixed relative position to the first module, and to unlock the second module from its fixed relative position to the first module so that the second module is slidable relative to the first module in directions parallel to the linear axis.

2. Bonding apparatus as claimed in claim 1, further comprising a mounting bracket for supporting the first module, wherein the mounting bracket is mounted on a rotary motor assembly which is operative to rotate the bonding tool about an axis of rotation which is parallel to the said linear axis.

3. Bonding apparatus as claimed in claim 2, including a central opening located in the rotary motor assembly to allow a light path parallel to the said linear axis to pass from the bonding point through to an optical assembly.

4. Bonding apparatus as claimed in claim 3, wherein the optical assembly is mounted to the first module.

5. Bonding apparatus as claimed in claim 1, further comprising a transducer and a wire clamp assembly mounted to the second module.

6. Bonding apparatus as claimed in claim 5, wherein the wire clamp assembly comprises a fixed jaw, a movable jaw and an actuating motor which are located substantially along an axis of rotation of the bonding apparatus so that a moment of inertia of the bonding apparatus during rotation is reduced.

7. Bonding apparatus as claimed in claim 1, further comprising a force sensor coupled between the first module and a motor for driving the first module along the linear axis, the force sensor being operative to measure action and reaction forces acting on the first module.

8. Bonding apparatus as claimed in claim 7, wherein the force sensor is further operative to detect a pulling force exerted by the bonding apparatus on the wire when the wire is connected to a bonded wire.

9. Bonding apparatus as claimed in claim 1, wherein the coupling mechanism further comprises an actuator that is operative to provide a force to releasably lock the second module to the first module and a linear guide to guide relative sliding movement between the second module and the first module.

10. Bonding apparatus as claimed in claim 9, wherein the second module is slidable with respect to the first module when the force from the actuator is deactivated.

11. Bonding apparatus as claimed in claim 1, wherein during wire bonding, a tip of the bonding tool is located at a distance equal to about a diameter of the wire lower than a tip of the wire cutter so that the bonding tool may press on the wire without the wire cutter contacting the wire.

12. Bonding apparatus as claimed in claim 1, wherein the wire cutter further comprises a linear cutter actuator operative to adjust an orientation of the wire cutter for programmable adjustment of a position of a tip of the wire cutter, and a spring for biasing the wire cutter against the linear cutter actuator.

13. Method of bonding a length of wire with a bonding apparatus comprising a first module and a second module slidably mounted to the first module, the method comprising the steps of:
   locking the second module in fixed relative position to the first module with a coupling mechanism;
   driving the first module and second module along a linear axis towards a bonding point and forming a bonded wire at the bonding point with a bonding tool mounted on the second module;
   unlocking the second module from its fixed relative position to the first module to allow the second module to slide relative to the first module parallel to the linear axis;
   driving the first module towards the wire to cut the wire with a wire cutter mounted to the first module; and thereafter
   lifting the wire cutter away from the bonded wire.

14. Method of bonding the length of wire as claimed in claim 13, wherein the wire cutter is operative to cut the wire partially and not fully while the bonding tool is pressing on the wire.

15. Method of bonding the length of wire as claimed in claim 14, wherein the wire cutter cuts into the wire by a distance of between 0.6 to 0.9 times of a diameter of the wire.

16. Method of bonding the length of wire as claimed in claim 13, including the step of locking the second module to the first module after lifting the wire cutter away from the bonded wire and thereafter tearing the cut wire from the bonded wire.

17. Method of bonding the length of wire as claimed in claim 13, further comprising the step of, after forming the bonded wire at the bonding point, driving the first module away from the bonded wire and creating a predetermined pulling force on the bonded wire, then monitoring the pulling force and/or position of the first module to determine whether the wire bond is defective.

18. Method of bonding the length of wire as claimed in claim 13, further comprising the step of viewing an orientation of multiple bonding points with an optical system and rotating the first module to align an orientation of the bonding tool with the orientation of the bonding points.

19. Method of bonding the length of wire as claimed in claim 18, further comprising the step of rotating the first module such that an optical center of the optical system is aligned next to a center of the bonding tool in a direction parallel to a length of a leadframe when bonding a matrix-type leadframe with multiple rows of packages arranged along its length.

20. Method of bonding the length of wire as claimed in claim 18, further comprising the step of rotating the first module such that an optical center of the optical system is aligned next to a center of the bonding tool in a direction perpendicular to a length of the leadframe when bonding a leadframe with a single row of packages arranged along its length.

* * * * *